US008012844B2

(12) United States Patent
Dirnecker et al.

(10) Patent No.: US 8,012,844 B2
(45) Date of Patent: Sep. 6, 2011

(54) METHOD OF MANUFACTURING AN INTEGRATED CIRCUIT

(75) Inventors: Christoph Dirnecker, Eching (DE); Philipp Steinmann, Richardson, TX (US); Badih El-Kareh, Cedar Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 12/624,442

(22) Filed: Nov. 24, 2009

(65) Prior Publication Data

US 2010/0136764 A1 Jun. 3, 2010

Related U.S. Application Data

(60) Provisional application No. 61/141,539, filed on Dec. 30, 2008.

(30) Foreign Application Priority Data

Dec. 2, 2008 (DE) ........................ 10 2008 060 077

(51) Int. Cl.
*H01L 21/20* (2006.01)

(52) U.S. Cl. ........ 438/384; 438/381; 438/637; 438/667; 257/E21.004; 257/E21.006

(58) Field of Classification Search .................. 438/359, 438/381–384, 637, 689; 257/536, 537, E21.004, 257/E21.006, E27.047
See application file for complete search history.

(56) References Cited

U.S. PATENT DOCUMENTS

| | | | | |
|---|---|---|---|---|
| 6,165,862 | A | 12/2000 | Ishikawa et al. | |
| 7,145,218 | B2 | 12/2006 | Eshun | |
| 2001/0049199 | A1 * | 12/2001 | Steinmann et al. | 438/697 |
| 2002/0020879 | A1 | 2/2002 | Shiiki et al. | |
| 2004/0152299 | A1 * | 8/2004 | Mahalingam et al. | 438/637 |
| 2006/0138596 | A1 * | 6/2006 | Danzl | 257/536 |

* cited by examiner

*Primary Examiner* — Charles Garber
*Assistant Examiner* — Abdulfattah Mustapha
(74) *Attorney, Agent, or Firm* — Jacqueline J. Garner; Wade J. Brady, III; Frederick J. Telecky, Jr.

(57) ABSTRACT

A method of manufacturing an integrated circuit comprises depositing a electrically resistive layer of a material for serving as a thin film resistor (TFR), depositing an electrically insulating layer on the resistor layer, removing the electrically insulating layer from outside an electrically active area of the resistor layer corresponding to a target TFR area, and depositing an electrically conductive layer of an electrically conductive material such that the conductive layer overlaps the target TFR area and the conductive layer electrically contacts the resistor layer outside the target TFR area.

13 Claims, 9 Drawing Sheets

METHOD OF MANUFACTURING AN INTEGRATED CIRCUIT

FIELD OF THE INVENTION

The invention generally relates to a method of manufacturing an integrated circuit and, more particularly to single mask integration for high precision thin-film resistors.

BACKGROUND

High precision analog devices need resistors with tight resistance control, a minimum possible absolute temperature coefficient of resistance (TCR) (i.e., the TCR should be as close to zero as possible) and excellent matching properties. These requirements can be fulfilled with metallic thin films made from low TCR alloys like NiCr, NiCrAI or SiCr. However, when integrating these kinds of resistors into existing process flows, special care has to be taken with respect to substrate planarity, accuracy of pattern definition and compatibility with standard interconnect processing, in particular etch selectivities and critical dimension (CD) losses. Often the desired performance can only be achieved by severe modifications to the manufacturing process, addition of multiple mask levels and/or narrower process windows. For example, in certain processes, integration of a SiCr thin film resistor results in three additional mask levels to the backend of the line because the resistor film is so thin that a direct connection with conventional interconnect vias is not possible. Instead, a local thin film VIA level and a resistor head level must be used.

FIG. 1 shows a semiconductor device 100 manufactured using such a conventional three mask level integration for a SiCr thin film resistor 104. A method for forming the device 100 is described in detail in U.S. Pat. No. 6,872,655.

An ultra thin SiCr layer 104 is deposited on a first intermetal dielectric 102 after a first chemical mechanical (CMP) planarization. The intermetal dielectric 102, as well as a metal layer 103, if required, is formed on a pre-metal dielectric (PMD) 101 and/or a first metal interconnect level. A thin film of insulating material 105 (for example tetra-ethyl-ortho-silicate (TEOS)) of the order of 1000 Å covers the SiCr resistor film 104 and an inter-level dielectric layer 107 is formed over the structure. Resistor heads 110 are formed on the thin film resistor 104. After formation of the resistor heads 110, the top portion of the first intermetal dielectric 102 is finalized. Finally the resistor head is connected to the second metal interconnect level 108 using conventional interconnect VIA1 processing. The resistor heads 110 act as an etch-stop layer for the vias 106 and have to be thick enough to sustain the higher overetch in the shallow openings for the vias 106. However, in order to form the structure shown in FIG. 1, three masking steps are required; a first to define the thin-film resistor layer 104, a second for creating the thin film via opening 106 and a third to form the resistor heads 110.

Solutions using fewer masks have already been proposed for thin film resistors. U.S. Pat. No. 6,737,326 discloses depositing a contacting metal directly on top of the resistor material, patterning metal lines together with the resistor body and then etching the contacting metal from the resistor body. However, the proposed method is only applicable to relatively thick resistor layers, as a thin SiCr thin film resistor layer cannot withstand the normal metal dry etch and the metal wet etch used for the contacting metal.

SUMMARY OF THE INVENTION

Accordingly, the invention provides a method of manufacturing an integrated circuit. The method comprises depositing a electrically resistive layer of a material for serving as a thin film resistor (TFR), depositing an electrically insulating layer on the resistor layer, removing the electrically insulating layer from outside an electrically active area of the resistor layer corresponding to a target TFR area, and depositing an electrically conductive layer (herein also called barrier layer) of an electrically conductive material such that the conductive layer overlaps the target TFR area and the conductive layer electrically contacts the resistor layer outside the target TFR area. By overlapping the conductive layer outside the target thin film area, which is covered by the insulating layer, the invention allows electrically contacting of the active thin film resistor area. The target active area of the resistor is the area of the resistive layer that defines its resistance. The dimensions of the overlapping areas can be easily chosen large enough to provide only small parasitic resistance. Further, once the thin film resistor layer is covered with a sufficiently thick conductive material, the normal post-processing steps can be performed.

BRIEF DESCRIPTION OF THE DRAWINGS

Further advantages and characteristics of the invention ensue from the description below of the preferred embodiments, with reference to the accompanying drawings, in which.

DETAILED DESCRIPTION OF THE EMBODIMENTS

Figure 1:
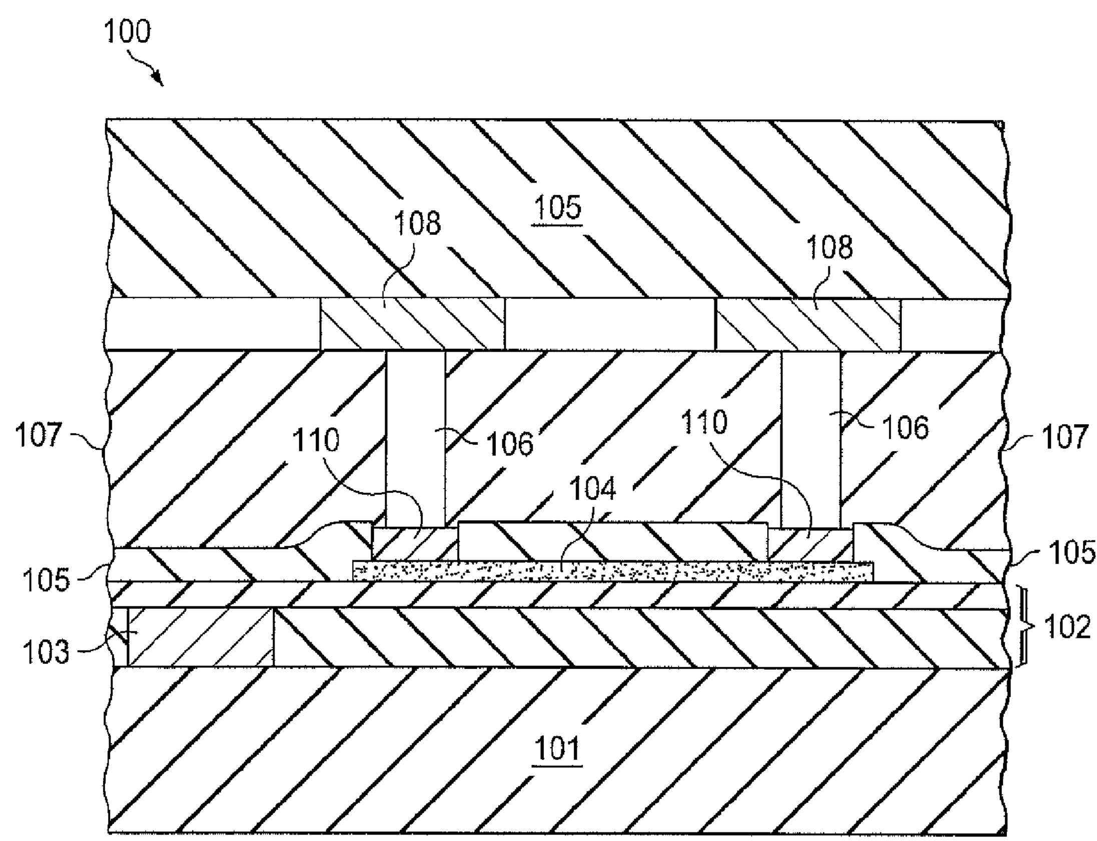
FIG. 1 is a simplified schematic of an integrated circuit having a thin film resistor manufactured according to a conventional method.

Embodiments of the invention will now be described generally followed by a more detailed description of specific embodiments with figures hereinbelow. A thin film resistor layer is deposited and then an electrically insulating layer is deposited on the thin film resistor layer. An electrically active area of the resistor layer forms a target thin film resistor area and the electrically insulating layer provided on the resistor layer outside this target thin film resistor area is removed. An electrically conductive material is deposited in a layer so as to form a conductive layer overlapping the target thin film resistor area, and which also forms an electrical contact (connecting regions) to the resistor layer outside the electrically active target thin film resistor area. This can be done by providing holes or openings in the insulating area or by dimensioning the insulating layer smaller than the resistive layer. By overlapping the conductive layer outside the target thin film area, which is covered by the insulating layer, the invention allows electrically contacting of the active thin film resistor area. The target active area of the resistor is the area of the resistive layer that defines its resistance. The dimensions of the overlapping areas can be easily chosen large enough to provide only small parasitic resistance. Further, once the thin film resistor layer is covered with a sufficiently thick conductive material, the normal post-processing steps can be performed. There may be a later processing step of structuring a layer of an interconnect level for which a specific mask is used. However, the conductive layer and the resistive layer can also be removed outside the target TFR area and the connecting regions by use of this mask. Therefore, the conductive layer can be removed outside the target TFR area and the connecting regions by use of the same single mask used for structuring the layer of an interconnect level. The same etching step may then be used to remove a layer of an interconnect level (e.g. the intermetal dielectric) and the resistive layer and/or the conductive layer. The layer of the interconnect layer may be an intermetal dielectric.

Preferably, the method further comprises removing the conductive layer on top of the insulating layer at least partially within the target TFR area such that at least two insulated connecting regions remain, which are coupled only through the resistor layer (i.e. through the TRF target area). Two insulated connecting regions left after partial removal of the conductive layer within the target TFR area can be coupled to each other through the resistor layer by partially removing the electrically conductive layer provided on top of the insulating layer inside the target TFR area. The electrically insulating layer that is deposited on top of the resistor layer allows the conductive layer to be removed from the resistor body without touching the thin film resistor material.

In one aspect of the invention, the method further comprises a partial etching step for removing the insulating layer outside the target TFR area only partially such that a layer of insulating material remaining on top of the resistor layer outside the target TFR area is thinner than a layer of insulating material on top of the resistor layer within the target TFR area. The insulating layer outside the target TFR area can be partially removed. This means that the insulating material outside the target TFR area is formed in a thinner layer than the insulating material inside the target TFR area on top of the thin film resistor. The thicker layer of insulating material inside the target TFR area can, for example, reduce the amount of etching on the surface of the thin film resistor due to a later sputtering step for depositing a barrier.

In another aspect of the invention, the method further comprises performing a dry etching step for completely removing the insulating layer outside the target TFR area. As an alternative to the partial etching step outlined above, the insulating layer may also be completely removed outside the target TFR area by dry etching. An insulating layer is still left inside the target TFR area (the electrically active area of the thin film resistor layer) for reducing the amount of sputter-etch on the surface of the thin film resistor at the later barrier deposition.

In a further aspect of the invention, the method may also comprise a dry etching step followed by a wet etching step for removing the insulating layer completely outside the target TFR area after the dry etching step. The insulating layer may also be completely removed outside the target TFR area by wet etching alone.

According to an advantageous aspect of the invention, a single mask can be used to remove the conductive layer and for structuring a layer of an interconnect level. As the target active area of the thin film resistor is covered by an insulating layer, the target area of the thin film resistor layer is protected against subsequent etching steps. Therefore, it is possible to apply an etching step which is basically conceived to etch, for example, a metal layer of a subsequent interconnect level, also to the conductive layer.

The method may further comprise depositing an etch stop layer on the resistor layer. This can be done after removal of the insulating layer outside the target TFR area. For very thin film resistor layers, additional deposition of an etch-stop layer provides protection to the surface of the resistor layer against sputter etching.

According to one aspect of the invention, the method further comprises depositing an inter-metal dielectric (IMD) on top of the electrically insulating layer, and the conductive layer used for contacting the thin film resistor layer, providing a recess in the IMD adapted to contain a VIA for connecting a conductive layer buried in the IMD, and filling the recess with tungsten (W). Excessive tungsten can then be etched back after the step of filling, According to another aspect of the invention, the method further comprises depositing an inter-metal dielectric (IMD) and the electrically insulating layer, providing a recess in the IMD adapted to contain a VIA for connecting a conductive layer buried in the IMD, and filling the recess with tungsten. Excessive tungsten may then be removed in a CMP step after the step of filling. The recess formed in the intermetal dielectric is suitable for containing a VIA, which can form an electrical connection to a buried conductive layer provided in the inter-metal dielectric.

Preferably, the insulating layer is only removed from outside the TFR target area after the excessive tungsten is removed in the CMP step. Once the excessive tungsten has been removed by chemical mechanical planarization, the insulating layer can be removed from the resistor layer outside the TFR target area. The insulating layer is then able to protect the area of the resistor layer outside the TFR target area from the chemical mechanical planarization processing.

The resistive layer may be of SiCr alloy. An ultra thin SiCr layer can be used because the active area of the resistor (the target area) is not exposed to an etch plasma or a wet chemical etch in the present invention. It is covered by the electrically insulating layer, which protects it from these processes. Use of a metallic thin film made from SiCr results in a resistor in which the resistance can be tightly controlled, that has a minimum temperature coefficient of resistance (TCR), and that has excellent matching properties.

The insulating layer may be a tetra-ethyl-ortho-silicate (TEOS) layer. The TEOS layer may immediately cover the thin film resistor, for example straight after annealing of the thin film resistor.

The inter-metal dielectric and the electrically conductive material may be structured either by a single mask by use of two separate masks. This allows a simple solution for connecting the thin film resistor by means of conventional interconnect processing without compromising the resistor performance.

In other words, the resistive layer (for the thin film resistor) is protected by an insulating layer. The insulating layer is selectively removed outside an active target area of the thin film resistor that is to be provided with the resistive layer. If the resistive layer is thick enough and if there is sufficient selectivity, a dry etching step may be performed. Otherwise, a combination of dry and wet etching may be used, or wet etching only. Further, a conductive layer can be deposited that overlaps the resistive layer so as to contact the resistive layer in at least two connecting regions. These connecting regions or contacts are arranged such that the target area of the resistive layer is maintained. The insulating layer (oxide) prevents that the resistor layer is affected during a structuring (removal) step of the conductive layer. In the same step when the conductive layer (metal) is structured, the insulated resistor is structured by removing the remaining resistive layer outside of the insulating layer, i.e. outside the target resistor area and the connecting regions. Eventually, contacts are formed, such that the connections to the resistive layer are only electrically coupled through the target resistor area. The TFR resistor may be coupled to metal layers through standard VIAs and is independent from the technology, as, for example W-etchback or W-CMP. However, this requires an additional mask for the connecting resistor heads. The number of masks can be reduced if an interconnect level and the resistive layer and/or the conductive layer are structured by use of the same mask. There is no need for an additional metal layer. Technologies with only one metal layer may be used.

An advantageous solution uses a standard interconnect metal layer and the metal wires are structured simultaneously with the resistor heads. This adds only one mask level for the TFR.

After PMD or IMD planarization the following steps may be performed in a technology with W-etchback for the first VIA level: providing the resistive layer and the insulating layer, removing the insulating layer outside the target resistor area, forming VIAs, depositing the barrier layer (metal, conductive layer), and, since the barrier layer may need sputter etching, either leaving a small sheet of insulating layer on top of the resistive layer or applying an etch stop layer. Then, the steps of depositing and etching (etchback) tungsten, depositing metal (interconnect level), structuring metal lines and resistor heads outside target TFR area can follow.

In a technology with W-CMP for the first VIA level and resistor deposition before VIA formation, the following steps can be performed: providing the resistive layer and the insulating layer, removing the insulating layer outside the target resistor area, forming VIAs, depositing the barrier layer (with the advantage that the resistor layer is protected by the insulating layer), depositing tungsten and performing CMP step, removing the insulating layer outside the target TFR area (since metal does not require sputter etch, the oxide may be completely and selectively removed from top of the resistive layer), depositing metal (interconnect) and structuring metal and resistor heads (single mask).

In a technology with W-CMP and resistor deposition after VIA formation, the following steps can be performed: forming VIAs, depositing the barrier layer (conductive layer), depositing tungsten and performing CMP, depositing the resistor and the insulating layer (oxide), removing the insulating layer outside TFR target area, depositing metal (interconnect layer) and structuring metal and resistor heads.

Figure 2:
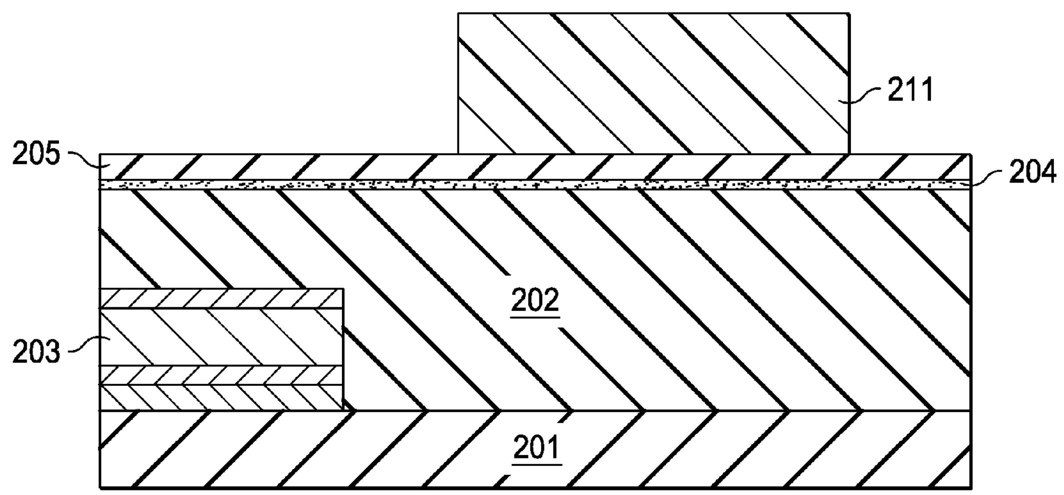
FIG. 2 is a simplified schematic of a stage of manufacture of an integrated circuit having a thin film resistor according to an embodiment of the invention.
Figure 3:
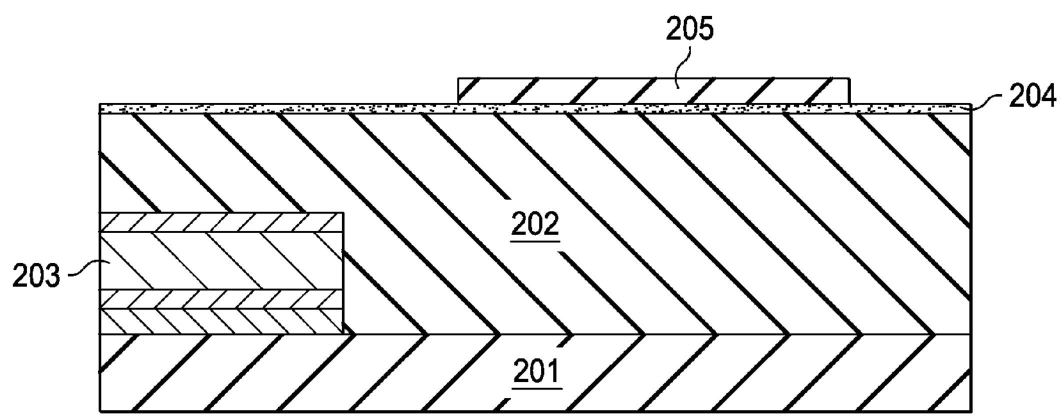
FIG. 3 is a simplified schematic of stage of manufacture of an integrated circuit having a thin film resistor according to an embodiment of the invention.

FIG. 2 shows one stage of fabricating an integrated circuit with a thin film resistor according to the invention. In the first stage of the method according to the invention, a first metal interconnect 203 and a first intermetal dielectric 202 are deposited on a pre-metal dielectric layer 201. The first intermetal dielectric 202 is completed with a single CMP planarization and a thin film resistor layer 204, for example made from silicon chromium alloy, is deposited on top of the first intermetal dielectric layer 202. The thin film resistor layer 204 is not directly patterned. Instead, a thin film of electrically insulating material 205, for example tetra-ethyl-ortho-silicate (TEOS), is deposited on top of the thin film resistor layer 204 so that the thin film resistor layer 204 is between the dielectric layer 202 and the thin film of insulating material 205. As shown in FIG. 3, a pattern of photoresist 211 is created after deposition of the insulating layer 205 to define the geometry of an electrically active area of the thin film resistor on the thin film resistor layer 204.

Next, the insulating layer 205 can be partially dry etched in the areas outside of the photoresist 211. A thin film of the insulating layer 205 (of a thickness of about 150 Å) may be kept on top of the thin film resistor layer 204 outside the pattern of photoresist 211 to reduce the amount of sputter etching on the surface of the thin film resistor layer 204 during later barrier deposition. The photoresist 211 is then removed from the surface of the insulating layer 205 and a cleaning of the surface of the insulating layer 205 with a solvent may be performed. Alternatively, as shown in FIG. 3, instead of just partially dry etching the insulating film 205, the insulating film layer 205 may be dry/wet etched or fully wet etched. Then the insulating layer 205 can be removed with a combined dry and wet etching process sequence with removal of the photoresist 211 between the dry and wet etch processes. However, there can be an additional critical dimension variation in the structure of the thin film resistor 204 covering the first metal interconnect 203 and first intermetal dielectric 202 deposited on a pre-metal dielectric layer 201, due to the wet etch process and, in this case, there is also a need for an additional conductive layer deposition, as will be explained later.

Figure 4:
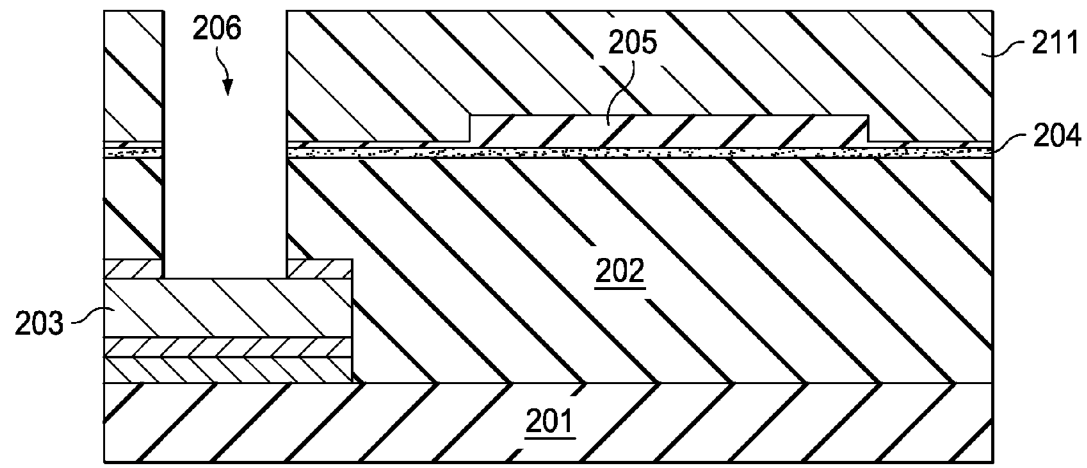
FIG. 4 is a simplified schematic of a stage of manufacture of an integrated circuit having a thin film resistor according to an embodiment of the invention.

A thin layer of insulating material 205 remains on top of the thin film resistor layer 204 in the region that is to be outside the electrically active area of the resistor and further photoresist 211 is deposited on top of the insulating layer 205, which creates a pattern for an opening for a via 206 (shown in FIG. 4). The photoresist 211 may be deposited directly on the surface of the thin film resistor layer 204, in order to form the opening for the via 206 shown in FIG. 4. Alternatively, when no insulating layer 205 remains on top of the very thin film resistor layer 204, an additional deposition of a film (for example of titanium, a titanium alloy, a silicon chromium alloy or a nickel chromium alloy) on the exposed thin film resistor layer 204 and the insulating layer 205 as an etch stop layer is performed prior to forming the opening for the via 206, in order to protect the thin film resistor layer 204 against sputter etching.

At the beginning of etching the via 206, the thin film of insulating material 205 underneath the via opening, as well as the thin film resistor layer 204 underneath the opening for the via 206 have to be removed. Since the thin film resistor layer 204 is very thin anyway, it is likely that it will automatically be removed when applying a standard via etch process for etching the via opening 206. Otherwise, the via etch process may be modified to use a different etch chemistry to suit the thickness of thin film resistor layer 204.

Then, as shown in FIG. 4, once the thin film resistor layer 204 has been etched, the opening for the via 206 completed. Part of the first intermetal dielectric layer 202 that covers the first metal interconnect level 203 and the pre-metal dielectric layer 201 is etched so that the via opening 206 stops on the first metal interconnect level 203. In an alternative embodiment, the opening for the via 206 is also etched down to the surface of the metal interconnect 203 but there is no insulating layer 205 on top of the thin film resistor 204 in the region of the via opening 206.

The photoresist 211 is then removed from the surface of the insulating layer 205 by etching. A conventional sputter etching process is used to remove the thin layer of insulating material 205 on top of the thin film resistor layer 204 in the region of the via 206 outside the electrically active area of the resistor. With a thick film of insulating material 205 left on top of the thin film resistor 204, this only results in a partial over-etch directly on the thin film resistor layer 204. The bottom of the opening for the via 206 receives a full amount of sputter-etch.

Figure 5:
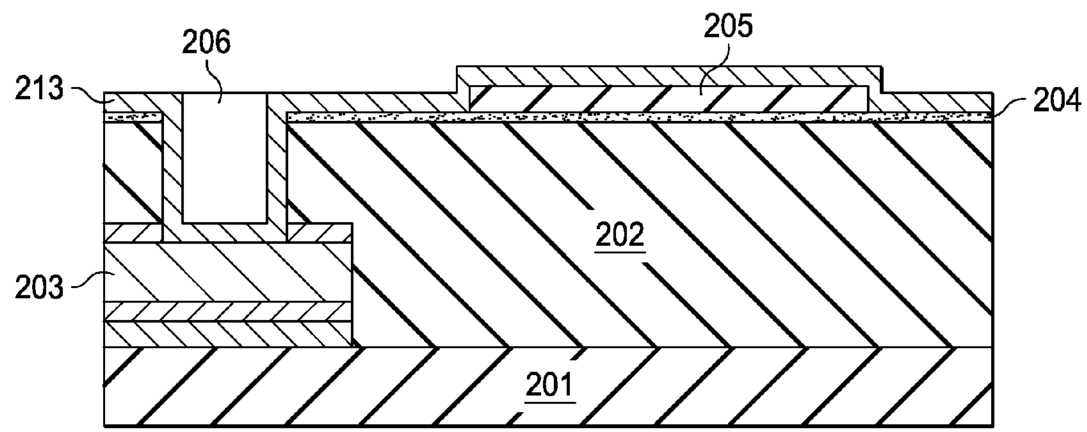
FIG. 5 is a simplified schematic of a stage of manufacture of an integrated circuit having a thin film resistor manufactured according to an embodiment of the invention.

FIG. 5 shows a stage of manufacture in which an interconnect for the via 206 is formed by filling the via opening with a conductive material. The thin film resistor layer 204 covers the whole wafer, having been deposited on the surface of the intermetal dielectric 202 opposite the surface of the intermetal dielectric 202 that contacts the pre-metal dielectric 201, except where the opening for the via 206 is located. An electrically conductive layer, which will be called a barrier layer 213 is deposited on top of the thin film resistor layer, the insulating layer 204 and in the opening for the via 206, so as to cover the exposed surfaces of the via opening (the closed end of the via opening closest to the first metal interconnect level 203). The barrier layer 213 (conductive layer) is in direct electrical contact with the thin film resistor layer 204.

Figure 6:
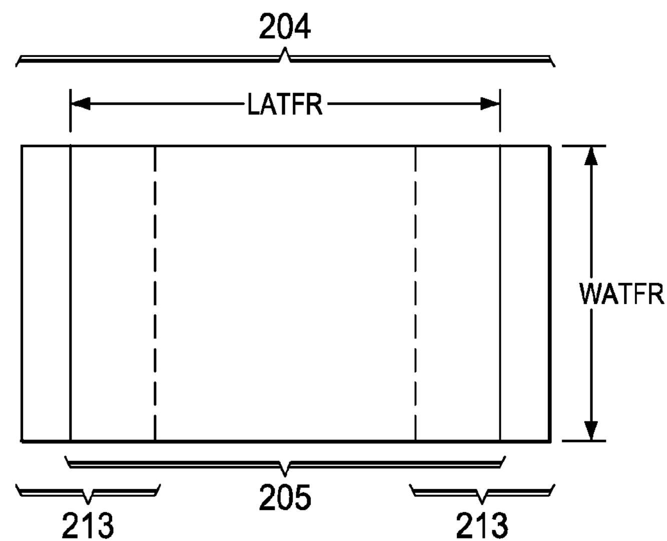
FIG. 6 is a simplified schematic of a stage of manufacture of an integrated circuit having a thin film resistor according to an embodiment of the invention.
Figure 6:
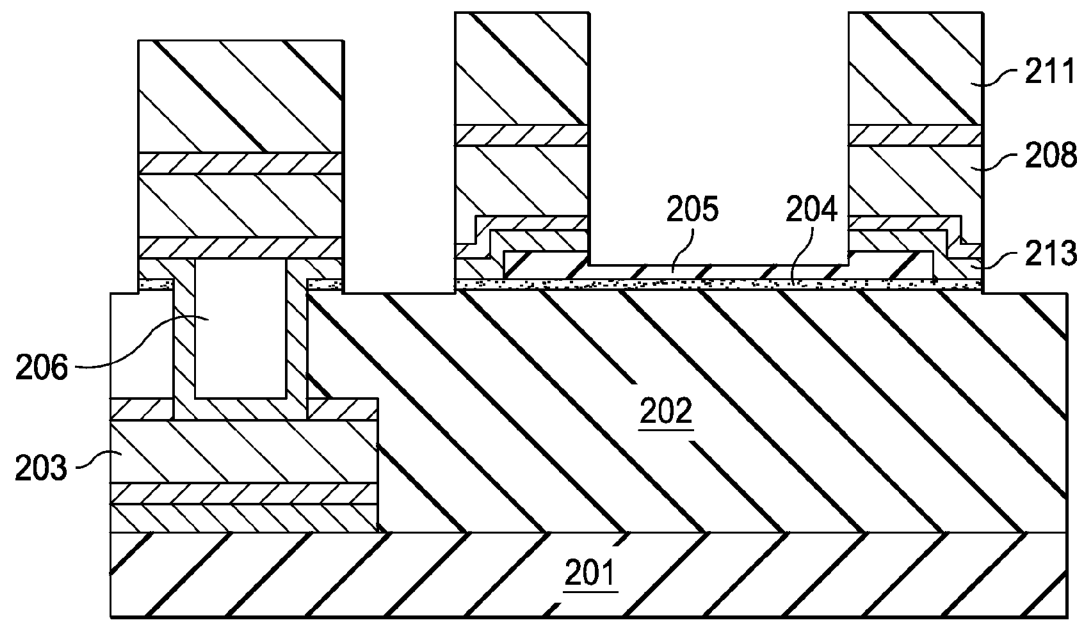

In one embodiment, a conductive film may be deposited between the barrier layer 213 and the thin film resistor layer 204, which provides an etch stop layer for the barrier sputter etching process. As described above, the barrier layer 213 is deposited on top of the structure so as to cover the exposed surfaces of the via opening. The barrier layer 213 is in electrical contact with the conductive film. A metal layer is then deposited on top of the barrier layer 213, which will form a second metal interconnect level 208, as shown in FIG. 6. Conventional photolithography is used to define the second metal interconnect level 208 and resistor heads simultaneously. The pattern for the resistor heads overlaps the insulating layer 205.

A pattern of photoresist is deposited above the via 206 and also so as to partially overlap the insulating layer 205 above the electrically active area of the thin film resistor layer 204 and partially overlap a part of the thin film resistor layer 204 not covered by the insulating layer 205. This means that the second metal interconnect level 208 will overlap the electrically active area of the thin film resistor layer 204 and will also be in electrical contact with the part of the thin film resistor layer 204 outside its electrically active area. The thin film resistor layer 204 may either be connected directly (laterally) within the second metal interconnect level 208 or by subsequent via formation to the second metal interconnect level 208 shown in FIG. 6.

The metal layer is then etched to form the second interconnect level 208 and resistor heads in the regions not covered with photoresist. The resultant structure is shown in FIG. 6. Etching of the second metal layer removes the areas of the metal layer outside the photoresist 211, and also removes the exposed parts of the barrier layer 213 (i.e. the electrically conductive layer 213). In FIG. 6 the result of an over-etching process of the second metal layer is shown, which is used to remove the exposed parts of the thin film resistor layer 204. This isolates the metal interconnects in the second metal interconnect level 208 (which is formed above the pre-metal di-electric layer 201, the first intermetal dielectric layer 202, the first metal interconnect level 203 and the via 206) from each other and also from the thin film resistor 204. The resistor heads in the second metal interconnect level 208 overlap (i.e. they extend over) the layer of insulating material 205 that covers the thin film resistor 205 and connect the thin film resistor 204 at both ends of the electrically active area (target area of the thin film resistor). According to this aspect of the invention, it is possible to etch the barrier layer 213 and one or more layers of the second interconnect level by use of the same single mask. As the barrier layer (and optionally an etch stop layer) is deposited above the insulating layer 205, the risk of etching through the thin film resistor layer 204 is avoided. Therefore, the normal etching steps usually only applied to layers of the interconnect level (e.g. a metal layer MET2) can also be used for the conductive layer (barrier layer 213). The amount of the insulating layer 205 that is etched away during overetching of the second metal interconnect level 208 determines the initial thickness of the insulating layer 205 above the electrically active area of the thin film resistor layer 204. Etching of the second metal interconnect level 208 stops in the insulating layer 205 and does not affect the thin film resistor layer.

In the upper right corner of FIG. 6, a top view on the semiconductor device is shown, where the dimensions of the active TFR target area (WATFR×LATFR), the barrier layer 213, the insulating layer TEOS 205 and the contact regions CONTACT between resistive layer (TFR layer) 204 and barrier layer 213 are illustrated. The width and length of the active TFR target area is indicated with WATFR (width) and LATFR (length). The contact area is indicated with CONTACT. The barrier layer 213 extends beyond the insulating layer TEOS 205, which directly covers in this embodiment the active TFR target area. The resistor heads (above the contact regions CONTACT and may be partially overlapping the insulating layer 205) can be formed by use of single mask and a single etching step, wherein the intermetal dielectric (2. IMD) and/or the barrier layer, and/or the resistive layer are removed at once. The resistor heads may also be formed by use of openings in insulating layer 205. Even if openings in the insulating layer 205 are used, a single mask step and manufacturing step for removing intermetal dielectric (2. IMD) and/or the barrier layer, and/or the resistive layer outside contact and active TFR target area may advantageously be applied.

Figure 7:
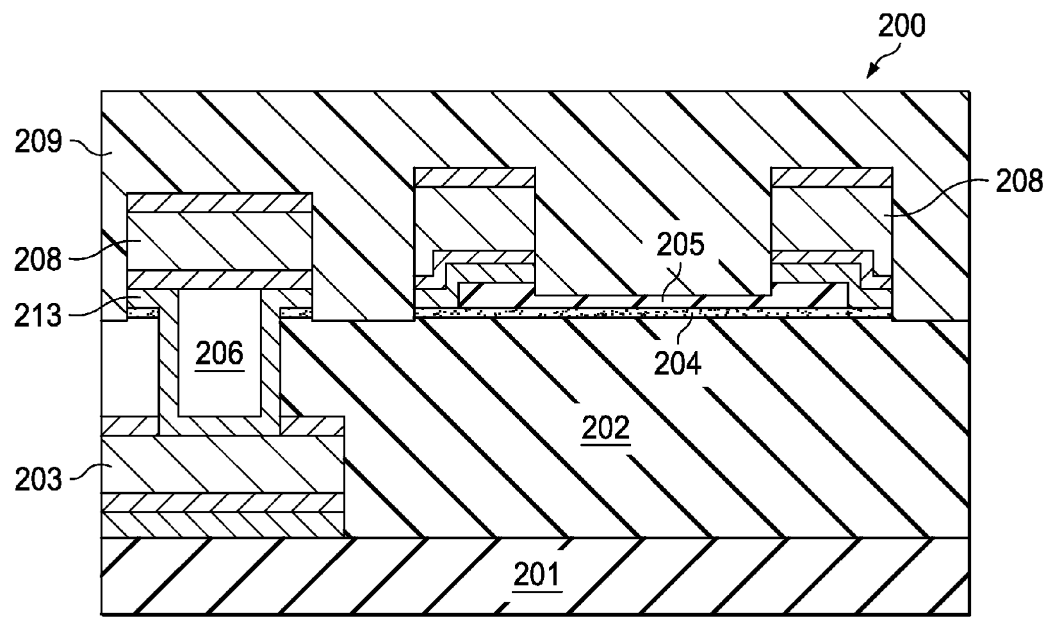
FIG. 7 is a simplified schematic of an integrated circuit having a thin film resistor manufactured according to an embodiment of the invention.

FIG. 7 shows the complete structure of the integrated circuit 200 after removal of the photoresist 211. The complete structure has the first intermetal dielectric layer 202 and the first metal interconnect level 203 provided on the pre-metal dielectric layer 201, with the via 206, lined with barrier layer 213, being provided in the first intermetal dielectric layer 202. The thin film resistor layer 204 is provided on a surface of the first intermetal dielectric 202 opposite the pre-metal dielectric so that it partially covers that surface of the first intermetal dielectric layer 202. The insulating layer 205 provided on the thin film resistor layer 204 does not completely cover the insulating layer 205 so that the second metal interconnect level 208 may contact both the thin film resistor layer 204 and the insulating layer 205. Conventional solvents or polymer remove chemistries may be used for cleaning the surface of the structure without laterally attacking the thin film resistor layer 204 underneath the layer of insulating material 205. The thin film resistor layer 204 has become part of the second metal interconnect layer 208 but the presence of the thin film resistor layer 204 will not change the performance of the metal interconnects or the via 206. A second inter-metal dielectric layer 209 is deposited on top of the structure to finalize the integrated circuit 200.

Figure 8:
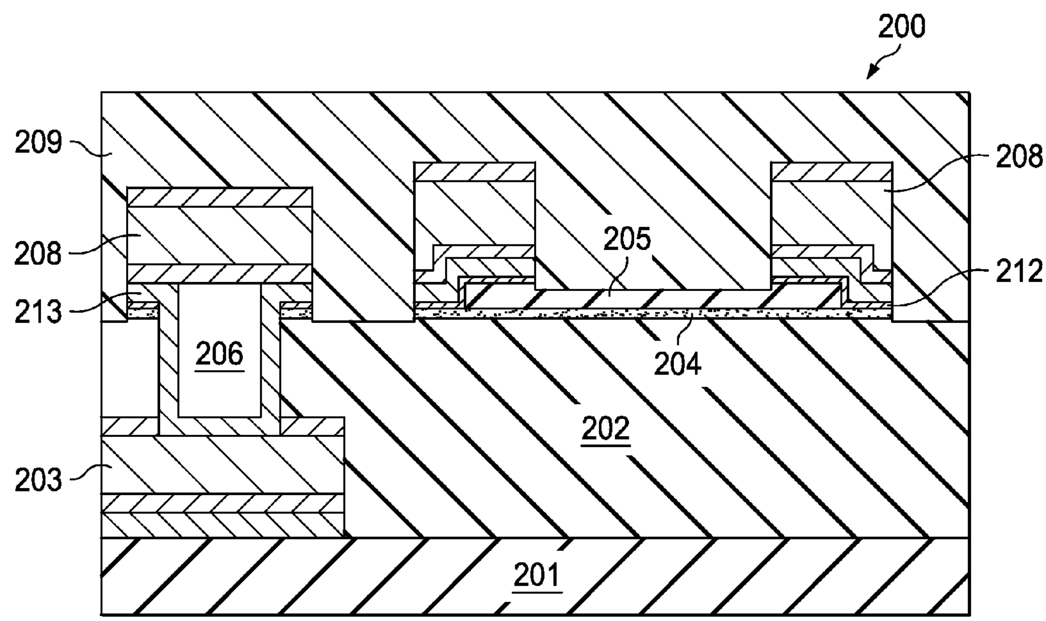
FIG. 8 is a simplified schematic of an integrated circuit having a thin film resistor manufactured according to an embodiment of the invention.

FIG. 8 shows a structure of an integrated circuit 200 manufactured according to an embodiment after deposition of the second inter-metal dielectric layer 209. The structure manufactured according to this embodiment of the invention has the presence of an additional conductive layer 212 in the second metal interconnect level 208, between the barrier layer 213 and the thin film resistor layer 204. This conductive layer 212 provides an additional etch stop during the barrier sputter etch process. Apart from the presence of the additional conductive layer, the other layers (as well as the structure and configuration of the layers) are the same as that of the integrated circuit shown in FIG. 7 and have been given the same reference signs.

Figure 9:
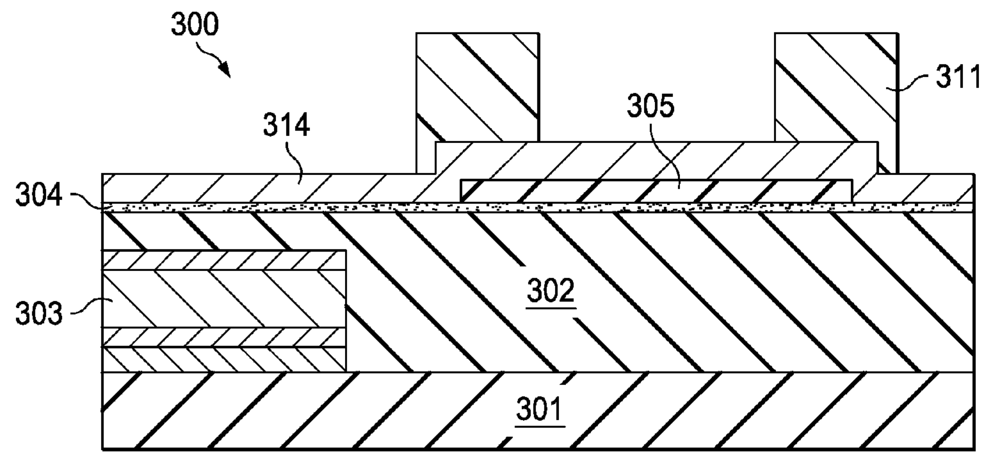
FIG. 9 is a simplified schematic of a stage of manufacture of an integrated circuit having a thin film resistor according to an embodiment of the invention.
Figure 10:
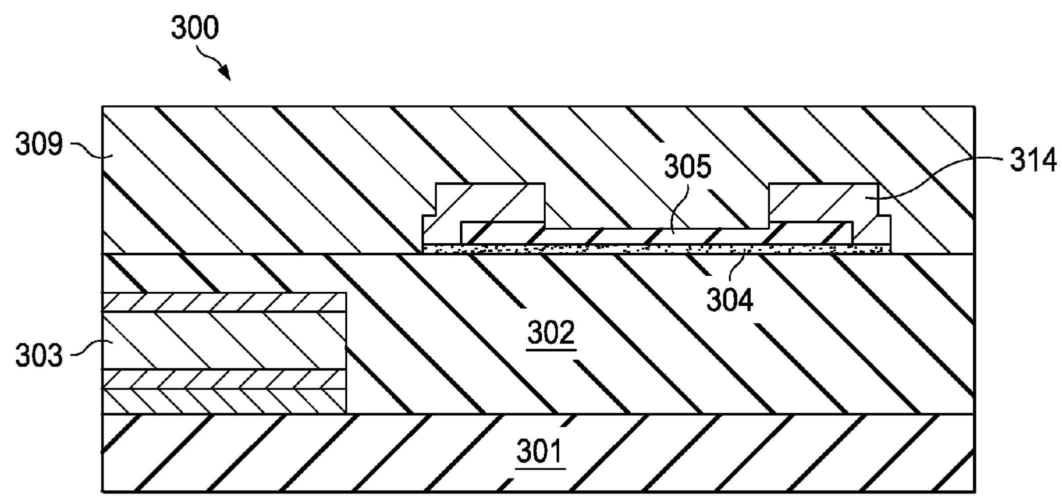
FIG. 10 is a simplified schematic of a stage of manufacture of an integrated circuit having a thin film resistor manufactured according to an embodiment of the invention.
Figure 11:
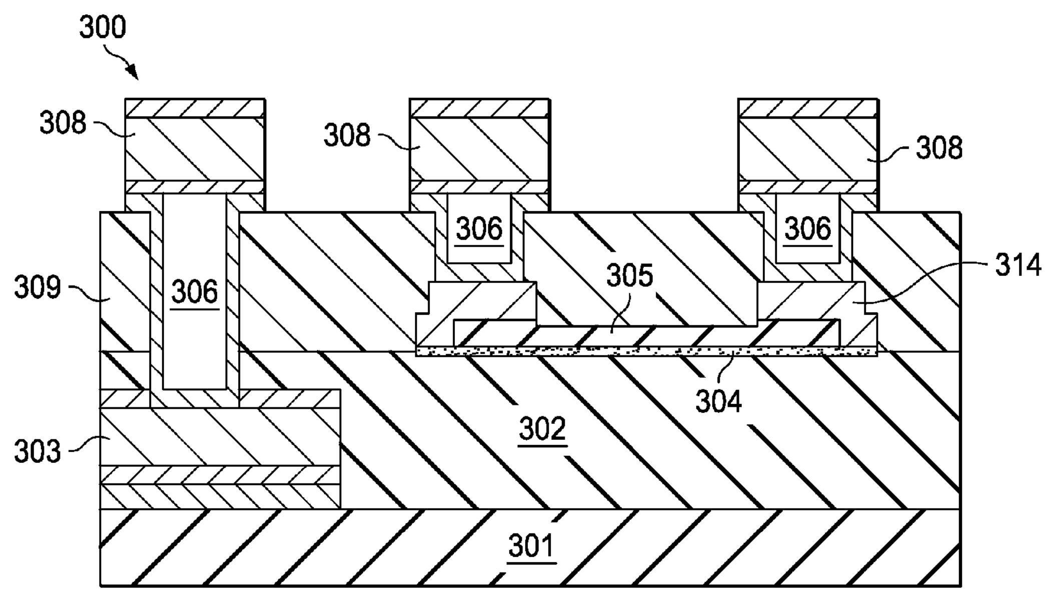
FIG. 11 is a simplified schematic of an integrated circuit having a thin film resistor manufactured according to an embodiment of the invention.

In an embodiment of the invention, described with reference to FIGS. 9 to 11, the structure of the integrated circuit 300 is such that the resistor heads are separated from the interconnect metal. A metal interconnect 303 is formed on a pre-metal dielectric layer 301 so as to just partially cover the pre-metal dielectric layer 301. A first intermetal dielectric 302 is deposited on the pre-metal dielectric layer 301 and covers both the pre-metal dielectric layer 301 and the metal interconnect 303. A thin film resistor layer 304 is then deposited on the surface of the first intermetal dielectric. The thin film resistor layer 304 may also be formed of SiCr, as in the previous embodiments. An insulating layer 305 is grown on top of the thin film resistor layer 305 and is partially etched to expose areas of the surface of the thin film resistor layer 304. The insulating layer 305 may be formed of tetra-ethyl-ortho-silicate (TEOS). An ashing and cleaning process to clean the exposed surfaces of the thin film resistor 304 and the insulating layer 305 then takes place.

A metal layer that will eventually form the resistor heads 314 is deposited on the exposed surfaces of the thin film resistor layer 304 and the insulating layer 305, then photoresist 311 is deposited on the metal layer in a pattern of the desired resistor heads 314. The resistor heads 314 may be formed of titanium tungsten (TiW) or a titanium and titanium nitride mixture (Ti/TiN), for example. The metal layer is then etched in the exposed regions not covered by the photoresist 311 so as to form resistor heads 314 that partially cover the insulating layer 305 and touch the surface of the thin film resistor layer 304 in the regions where it is not covered by the insulating layer 305. During etching of the metal layer, the areas of the thin film resistor layer 304 not covered by the photoresist 311 are also etched, with the etch stopping at the surface of the first intermetal dielectric 302 and on the surface of the insulating layer 305 not covered by a pattern of photoresist 311. The insulating layer 305 is then exposed in a region between the resistor heads 314. A further ash and cleanup process then takes place to remove the photoresist 311. A second intermetal dielectric layer 309 is then deposited on top of the insulating layer 304, the resistor heads 314 and the exposed surface of the first intermetal dielectric 302, with the surface of the second intermetal dielectric layer 309 then being processed by chemical mechanical planarization (CMP). Vias 306 are then formed by etching openings in the second intermetal dielectric 309. One via opening is etched completely through the second intermetal dielectric 309 and partially through the first intermetal dielectric 302 so as to stop on the surface of the interconnect metal 303. The other via openings are etched partially through the second intermetal dielectric 309 so as to stop on the surface of the resistor heads 314. The via openings are then filled to form vias 306 and then a second level of metal interconnects 308 are formed on the surface of the vias 306 to complete the structure of the integrated circuit 300.

Figure 12:
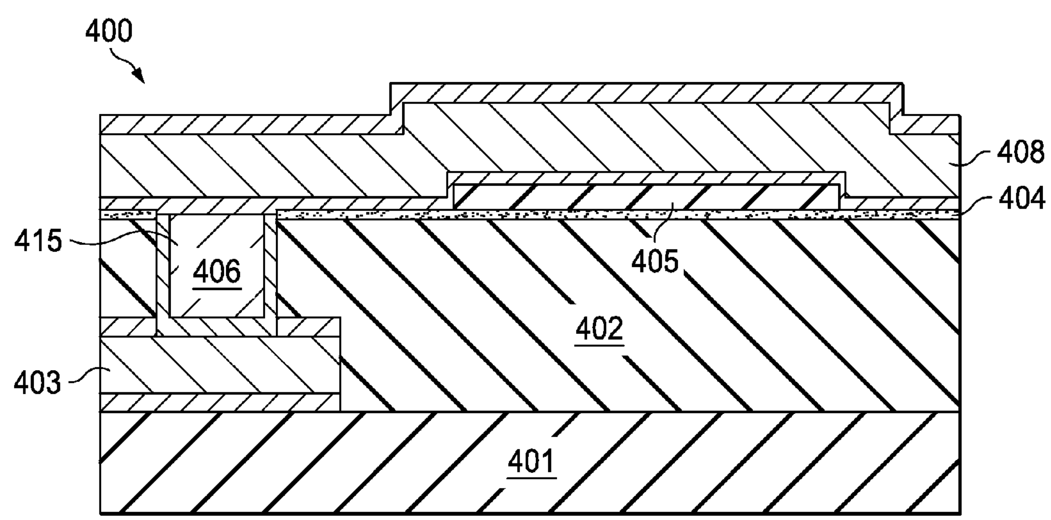
FIG. 12 is a simplified schematic of a stage of manufacture of an integrated circuit having a thin film resistor according to an embodiment of the invention.
Figure 13:
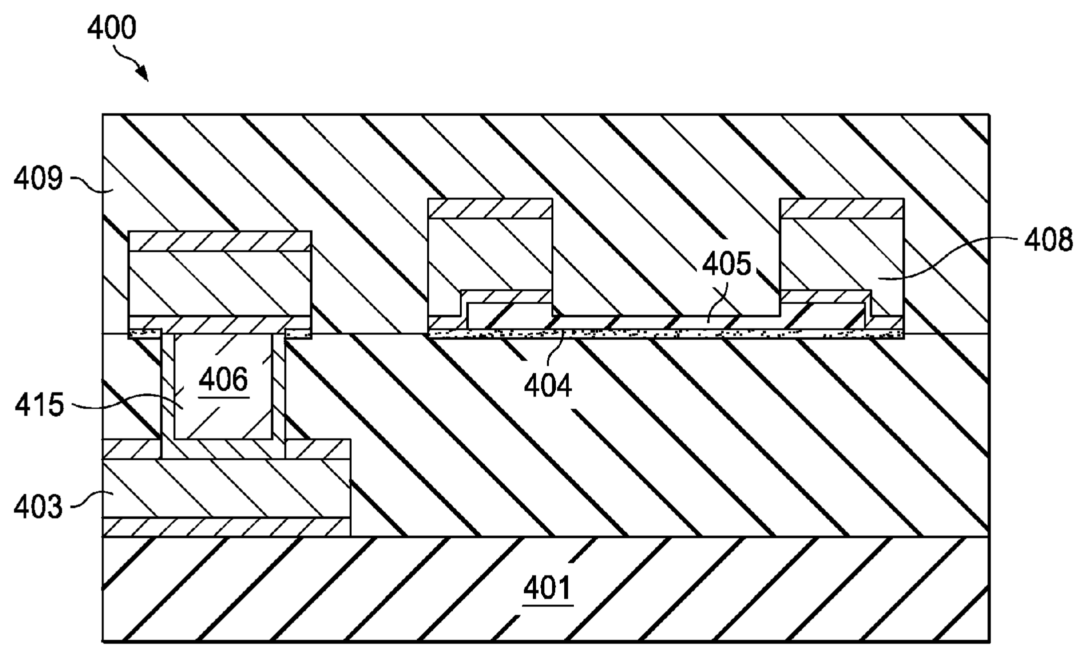
FIG. 13 is a simplified schematic of an integrated circuit having a thin film resistor manufactured according to an embodiment of the invention.

A further embodiment of the invention will now be described with reference to FIGS. 12 and 13. FIG. 13 shows the completed integrated circuit 400. A first metal interconnect region 403 and a first intermetal dielectric 402 are deposited on to the surface of a pre-metal dielectric 401 so that the first intermetal dielectric 402 covers both the surface of the pre-metal dielectric 401 and the surface of the first metal interconnect region 403. The first intermetal dielectric 402 is then planarized and a thin film resistor layer 404 is deposited on the surface of the first intermetal dielectric 402. An insulating layer 405, for example of TEOS, is deposited on the thin film resistor layer 404. As in the previous embodiments described above, an opening for a via 406 is then etched through the insulating layer 405, thin film resistor layer 404 and the first intermetal dielectric layer 402. The etch is stopped on the surface of the first metal interconnect region 403.

A barrier layer 420 is then deposited so that it covers the surface of the insulating layer 405, as well as all exposed surfaces in the via opening 406. The barrier layer 420 can be formed of TiN and may be deposited by chemical vapour deposition (CVD). A tungsten layer 415 is then deposited over the barrier layer 420 so as to fill the via opening 406 and form a plug therein. The surplus tungsten 415 that does not form the plug in the via opening 406, along with the barrier layer 420 may be removed by CMP, which stops on top of the insulating layer 405. For formation of the via 406, it can be desirable to have none of the tungsten plug recessed in the via opening with respect to the surface of the insulating layer 405. However, in this embodiment, it is also possible to recess the plug of tungsten 415 with respect to the insulating layer 405 so that the step height is minimized after etching of the insulating layer 405. A pattern of photoresist may then be used to cover the insulating layer 405 in the region where it is desired to have the electrically active area of the thin film resistor layer 404, with the location of the via 415 being exposed; i.e., not covered with photoresist. The insulating layer 405 can be partially dry etched so that just a very thin film of the insulating layer 405 is left on top of the thin film resistor layer 404. At the same time as the insulating layer 405 is etched, the tungsten plug 415 may also be etched. As stated above, the height of the tungsten plug 415 in the via recess relative to the surface of the insulating layer 405 can be chosen such that the step height of the via 406 in the final structure of the integrated circuit 400 is minimized relative to the surface of the insulating layer 405.

The structure can be dipped in hydrofluoric acid (HF), which removes the remaining exposed thin film of insulating layer 405 and the photoresist can be removed from the surface of the insulating layer 405 by an ash and cleanup process. Removal of the photoresist may take place either before or after the HF dip. The surface of the structure may alternatively be sputter etched before depositing a metal layer, which is used for forming the second metal interconnect level 408. The metal layer can be a Ti/TiN/Al/TiN multilayer structure, for example. In this embodiment, there is no thin film resistor layer between the tungsten plug 415 at the surface of the via 406 and the second metal interconnect level 408. A further pattern of photoresist can be deposited on top of the metal layer in the pattern of the second metal interconnect level 408. This pattern covers the interconnect line over the via 406 and the electrically active area of the thin film resistor layer 404 to allow electrical connection to the via 406 and the electrically active area of the thin film resistor layer 404. The exposed metal layer is etched to remove the surplus metal not forming the second interconnect level 408. Metal interconnects 408 are formed over the via 406 and over the electrically active area of the thin film resistor 404 at either side of this area to create resistor heads. A further etching step removes the exposed parts of the thin film resistor layer 404, which stops in the insulating layer 405 so that the insulating layer 405 is partially etched and forms a protective cover over the electrically active area of the thin film resistor 404. A second intermetal dielectric layer 409 is deposited over the second level of metal interconnects 408 so as to completely cover the metal interconnects 408.

Figure 14:
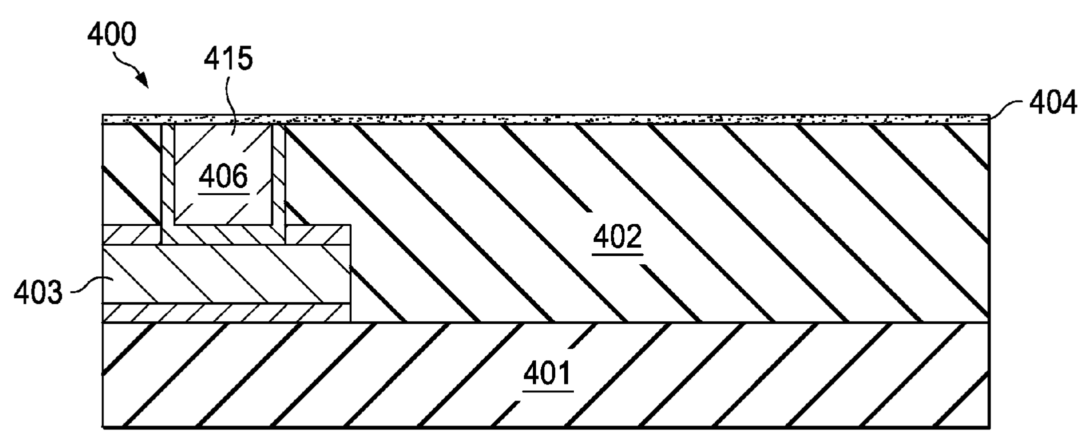
FIG. 14 is a simplified schematic of a third stage of manufacture of an integrated circuit having a thin film resistor according to an embodiment of the invention.
Figure 15:
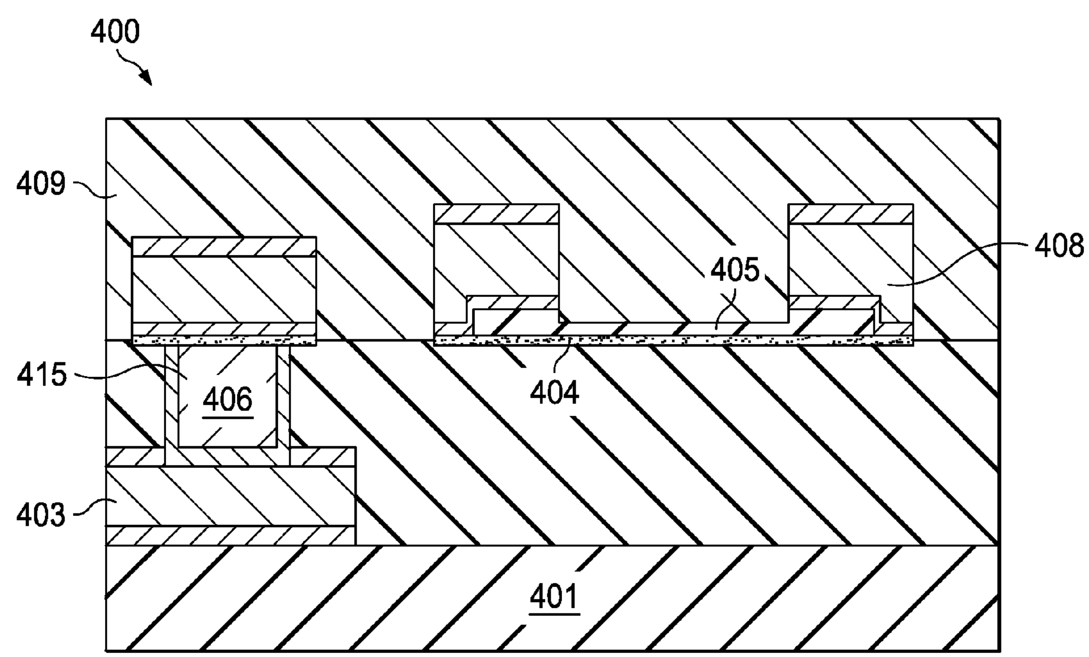
FIG. 15 is a simplified schematic of an integrated circuit having a thin film resistor manufactured according to an embodiment of the invention.

As an alternative embodiment, the via 406 may be formed in the first intermetal dielectric layer before deposition of the thin film resistor layer 404 and the insulating layer 405. This stage of fabrication is shown in FIG. 14. The structure of the integrated circuit 400 of this alternative embodiment is shown in FIG. 15. Formation of the via 406 may take place by etching a via opening to stop on the surface of the first metal interconnect region 403 (formed on the surface of the pre-metal dielectric layer 401), filling the via opening with a tungsten plug 415 and processing the surface of the tungsten plug 415 with W-CMP. After the step of completing formation of the via 406 by W-CMP, the thin film resistor layer 404 can be deposited on the surface of the first intermetal dielectric 402 and the exposed surface of the tungsten plug in the via 406. An insulating layer 405 may then be deposited over the thin film resistor layer 404 and photoresist may cover the area in which it is desired to have the electrically active area of the thin film resistor layer 404. A dry etch followed by a wet etch removes the exposed areas of the insulating layer 405 not covered by the photoresist. The etch stops at the surface of the thin film resistor layer 404. The photoresist is then removed by a standard cleaning process. As in the previous embodiment, a metal layer can be deposited and etched to form a second level of metal interconnects 408 over the via 406 and the electrically active area of the thin film resistor layer 404, then the exposed areas of the thin film resistor layer 404 not covered by the metal interconnects 408 are etched, with the etch stopping on the surface of the first intermetal dielectric layer 402. A second intermetal dielectric layer 409 may then be deposited so as to completely cover the surface of the structure. In this embodiment, there is no change in the amount the tungsten plug 415 is recessed; i.e., there is no variation in step height relative to surrounding structures, however, there is no direct connection between the via 406 and the second metal interconnect level 408 because the thin film resistor layer 404 will remain between the via 406 and the second metal interconnect level 408.

In some or all embodiments, the thin film resistor layer may be embedded in the integrated circuit structure between the first intermetal dielectric layer and an insulating layer. The resistor layer may also be positioned between the first intermetal dielectric and the second metal dielectric. The insulating layer covers the resistive layer directly. After structuring the insulating layer, the resistive layer may extend over the insulating layer. This means that the physical dimensions (length, width) of the resistive layer may be greater than the physical dimensions of the remaining insulating layer after structuring the insulating layer. This can simplify the production process. In alternative embodiment opening may be formed in the insulating layer for contacting the resistive layer.

Although the present invention has been described hereinabove with reference to specific embodiments, it is not limited to these embodiments and no doubt further alternatives will occur to the skilled person that lie within the scope of the invention as claimed.

The invention claimed is:

1. A method of manufacturing an integrated circuit, the method comprising:

depositing a electrically resistive layer of a material for serving as a thin film resistor (TFR), depositing an electrically insulating layer on the resistor layer, removing the electrically insulating layer from outside an electrically active area of the resistor layer corresponding to a target TFR area, depositing an electrically conductive layer of an electrically conductive material such that the conductive layer overlaps the target TFR area and the conductive layer electrically contacts the resistor layer outside the target TFR area, partially removing the conductive layer such that at least two electrically insulated connecting regions remain, which are electrically coupled only through the resistor layer, and removing the conductive layer and the resistive layer outside the target TFR area and the connecting regions.

2. The method according to claim 1, wherein the step of removing the conductive layer and/or the resistive layer outside the target TFR area and the connecting regions and a step of structuring a layer of an interconnect level are performed by use of the same single mask.

3. The method according to claim 1, further comprising a partial etching step for removing the insulating layer outside the target TFR area only partially such that a layer of insulating material remaining on top of the resistor layer outside the target TFR area is thinner than a layer of insulating material on top of the resistor layer within the target TFR area.

4. The method according to claim 3, further comprising a wet etching step for completely removing the insulating layer outside the target TFR area.

5. The method according to claim 1, further comprising a dry etching step followed by a wet etching step for completely removing the insulating layer completely outside the target TFR area after the wet etching step.

6. The method according to claim 1, further comprising depositing an etch stop layer on the resistor layer.

7. The method according to claim 1, further comprising depositing an inter-metal dielectric (IMD), providing a recess in the IMD adapted to contain a VIA for connecting a conductive layer buried in the IMD, and filling the recess with tungsten, wherein excessive tungsten is etched back after the step of filling.

8. The method according to claim 7, wherein the insulating layer is only removed from outside the TFR target area after the excessive tungsten is removed in the CMP step.

9. The method according to claim 1, further comprising planarising an IMD formation by chemical-mechanical planarisation and depositing the resistive layer on top of the planarised IMD formation.

10. The method according to any previous claim, wherein the resistive layer is of SiCr alloy.

11. The method according to any previous claim, wherein the insulating layer is a TEOS layer.

12. A method of manufacturing an integrated circuit, the method comprising:

depositing a electrically resistive layer of a material for serving as a thin film resistor (TFR), depositing an electrically insulating layer on the electrically resistive layer, depositing an inter-metal dielectric (IMD), providing a recess in the IMD adapted to contain a VIA for connecting a conductive layer buried in the IMD, and filling the recess with tungsten, removing excessive tungsten in a CMP step after the step of filling, removing the electrically insulating layer from outside an electrically active area of the resistor layer corresponding to a target TFR area, and depositing an electrically conductive layer of an electrically conductive material such that the conductive layer overlaps the target TFR area and a portion of the electrically insulating layer, wherein the conductive layer electrically contacts the resistor layer outside the target TFR area.

13. A method of manufacturing an integrated circuit, the method comprising:

depositing a electrically resistive layer of a material for serving as a thin film resistor (TFR), depositing an electrically insulating layer on the resistor layer, removing the electrically insulating layer from outside an electrically active area of the resistor layer corresponding to a target TFR area, depositing an electrically conductive layer of an electrically conductive material such that the conductive layer overlaps the target TFR area and a portion of the electrically insulating layer, wherein the conductive layer electrically contacts the resistor layer outside the target TFR area, partially removing the conductive layer such that at least two electrically insulated connecting regions remain, which are electrically coupled only through the resistor layer, and removing the resistive layer outside the target TFR area and the connecting regions.

* * * * *